United States Patent [19]

Smith

[11] Patent Number: 4,713,624
[45] Date of Patent: Dec. 15, 1987

[54] POWER AMPLIFIER WITH MODIFIED DYNAMIC RESPONSE

[76] Inventor: Randall C. Smith, 1317 Ross St., Petaluma, Calif. 94952

[21] Appl. No.: 916,156

[22] Filed: Oct. 7, 1986

[51] Int. Cl.$^4$ .............................................. H03F 3/28
[52] U.S. Cl. ..................................... 330/118; 330/121; 328/225
[58] Field of Search ....................... 330/118, 119, 121; 328/198, 225

[56] References Cited

U.S. PATENT DOCUMENTS 3,995,226 11/1976 Berning ............................... 330/121

Primary Examiner—Gene Wan
Attorney, Agent, or Firm—David B. Harrison

[57] ABSTRACT

A vacuum tube amplifying apparatus provides predetermined varying dynamic response characteristics in order to enhance the playing characteristics of musical instruments, especially guitar.

5 Claims, 2 Drawing Figures

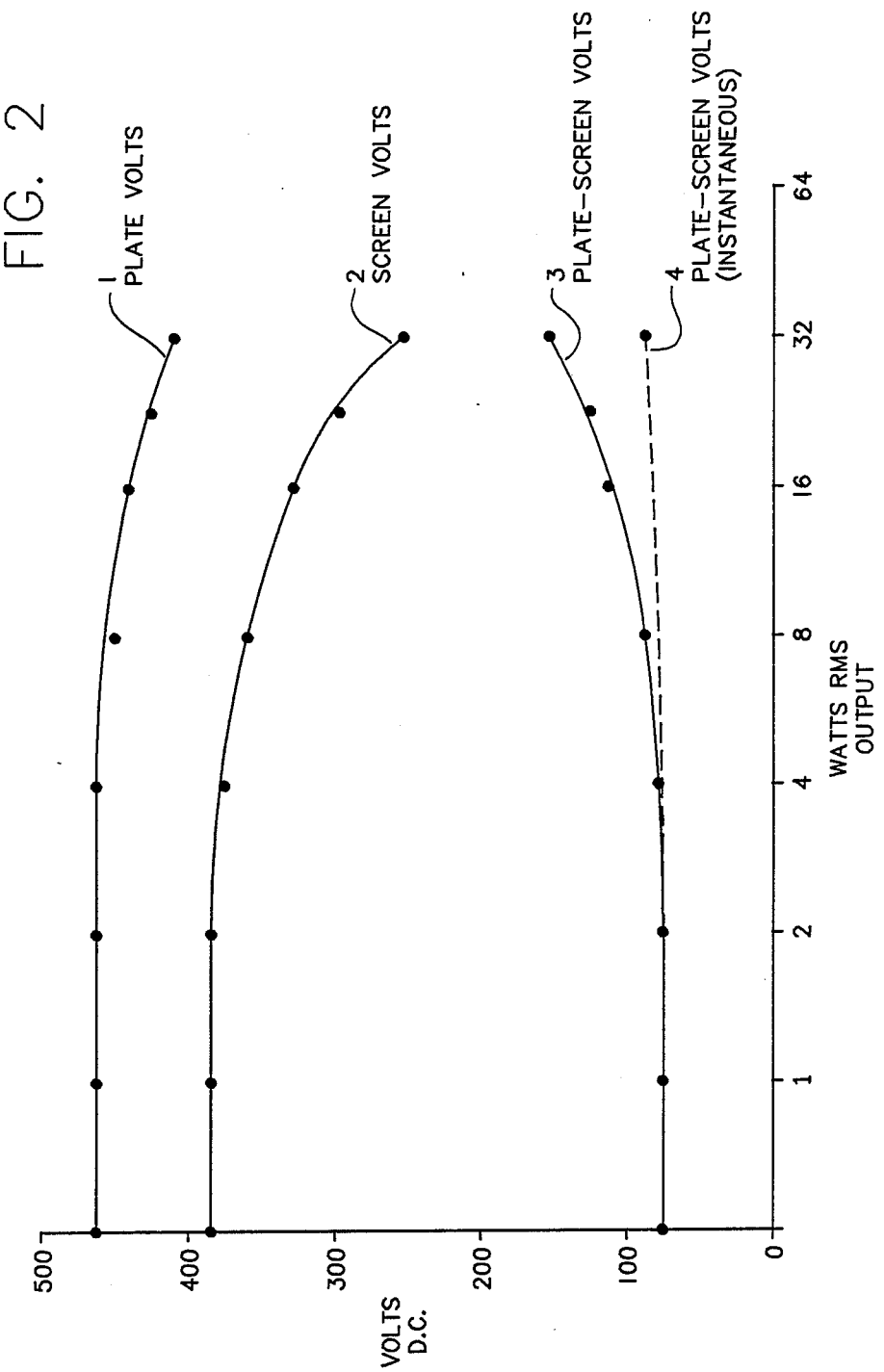

POWER AMPLIFIER WITH MODIFIED DYNAMIC RESPONSE

FIELD OF THE INVENTION

The present invention relates to power amplifier circuits for musical subject matter. More particularly, the present invention relates to a vacuum tube power amplifier having a predetermined varying dynamic response which is particularly well suited for the electrical guitar.

BACKGROUND OF THE INVENTION

In the field of musical instrument power amplifiers, examples of circuits which deviate from standard "hi-fi" or commercial designs in order to provide specific musical instrument enhancement(s) are rarely found. Most instrument-specific enhancement circuitry is found in the domain of preamplifier circuitry. The musician's power amplifier most often is virtually—or literally—follows one or another of the many commercially available high-fidelity power amplifier designs. Solid state power amplifiers often include peak limiters or compressors when used in musical systems in order to avoid undesirable clipping distortion, but this objective is more nearly the opposite from that of the present invention.

Distorted response (caused by saturation clipping) is often preferred for single-note solo passages, especially in the blues, rock and pop-music idioms. (Creating and enhancing "desirable" distortion characteristics can be a very vital enterprise resulting ultimately in successful artistic careers, and mass sales of recorded material.) Faithful, non-distorted power amplifier characteristics are similarly required for chordal playing plus single note solo passages in other musical styles.

Playing the modern electric guitar yields an "amplified" sensation which is a combination of tactile and musical experiences. The musician's fingers touch the instrument's mechanically active element—the string—both adjusting its length (fretting) and providing its vibrational energy (plucking and strumming). The mental "feedback look" between the physical sensation of "playing" and the auditory experience of "playing" is one of great intimacy for the accomplished musician and is all the more heightened by the inclusion of sensitive, dynamic amplification. It is precisely here, in coalition of tactile and auditory sensations that the present invention solves a longstanding problem of offering enhanced performance and satisfaction to the musician and to the audience which is both "giving and forgiving".

For the non-musician who may have trouble perceiving the virtues of an amplifier that is both "giving and forgiving," picture, for example, a pair of snow skis. Skis are certainly well known and in use, and from outside appearances, one looks very much like any other. Yet untold hours of development would have been invested in discovering and producing superior skis that have the "right amount" of "dynamic springiness" to be highly responsive at slow speeds and noticeably forgiving at high speeds.

In previous pentode audio power amplifiers, good voltage regulation of the screen grid supply has been relatively easy to obtain and has always been deemed a virtue in amplifier design. Often the screen grid D. C. supply is maintained at a constant voltage relative to ground via a dedicated voltage regulator or by a high current voltage divider that is relatively immune to fluxuating screen current demands. Another method very common to musical instrument amplifiers is to derive the screen voltage from the main B+ point (center tap of output transformer) through a filter resistor or a filter choke, either one of which has a very low D. C. resistance. Thus the screen supply is held a few volts lower than the plate supply and this small voltage drop remains practically constant under fluxuating load demands from the plate. Changes in the screen voltage occur virtually simultaneously with changes in the plate voltage (at least in "musically significant" measures of time) because high current demands from the plate actually drain voltage stored in the screen decoupling capacitor as well as the main B+ filter, through the small D. C. resistance between them. And in the version of screen supply known as "ulta-linear" the screen voltage is derived from taps on the primary winding of the output transformer, where again it fluxuates simultaneously with and thereby tracks the D. C. plate voltage.

SUMMARY OF THE PRESENT INVENTION

The present invention combines surprising and unusual component values in an otherwise conventional vacuum tube power amplifier circuit configuration. The result is a power amplifier with unusual dynamic response characteristics which achieve two different, unexpected, and opposite results: distorted and non-distorted reproduction of musical sounds without manual adjustment of the amplifier by the musician. These two opposed characteristics are the two main types of amplifier response most favored by the electric guitar player.

At certain settings (moderate power up to onset of clip) the modified amplifier exhibits enhanced dynamic headroom while exaggerating the attack of each note as it is plucked. This creates a sensation that musicians enjoy and describe as a "punchy, elastic and spongey response," one that "has give" as opposed to one that is "stiff and hard." Yet at other settings, namely when intentionally driven into saturation clipping, the modified power amplifier exhibits suppressed dynamic response which musicians often find preferable for this type of playing, characterizing the amplifier's response as "smooth and fluid" and "noticeably forgiving" of minor playing inaccuracies.

What the present invention does for the first time is discover and produce similar dynamic sensations in a single musical power amplifier dedicated primarily to the quitarist. The benefits of the amplifier with modified varying dynamic response are all the more appreciable because standard design practice dictates in favor of well regulated circuits which produce "stiff, hard and unforgiving" (i.e. unvarying) dynamic response.

In the Modified Power Amplifier of the present invention, the D. C. screen voltage and driver supply is derived from the main B+ supply though a several thousand ohms resistance—not a few tens or hundreds of ohms as is typical for power amplifiers of the push-pull vacuum tube variety. In addition, a decoupling capacitor of several times the rating required for stability and filtering is used as a "discharging current reservoir." This combination causes the D. C. screen voltage to fluxuate primarily in response to changing screen current demands but to do so only after passage of "musically significant" periods of time (a few hundred milliseconds).

Thus, in anticipation of the high-transient attack of a plucked guitar string, the amplifier's power sensitivity is at a maximum value due to the fully charged state of the "current resevoir" filter capacitor and the appearance on the screen and in the driver circuit of maximum D. C. voltage. Because of the high peak-to-average ratio in the output of a plucked string, power amp clipping on the attack transient of notes is extremely common. And although screen current demand remains relatively constant through most of the plate's linear region, there is a rapid increase in current that begins just as the onset of plate saturation approaches. When the discharge and recharge rates of the screen current storage capacitor are optimized, the amplifier acquires the "spongey, elastic give" so noticeable to the guitar player. Clean signal headroom and transient attacks both seem heightened because the plucked note is accompanied by a discharge of stored energy and followed by a lowering of power sensitivity as the supply voltage drops to both the screen and the driver circuitry. This effect is particularly noticeable when the string attack exceeds the amplifier's clean power capability because the screen current increases very rapidly after the onset of plate saturation. So the corresponding drop in screen voltage (through the several thousand ohms resistor) causes a significant drop in amplifier power sensitivity, but only after the initial attack has occured. Excessive or repeated attempts to saturate the plate result in the fluid "soft-clip" described earlier as "forgiving" because the screen and driver voltages—and hence the power sensitivity—remain low. Soft clipping ensues because the output tubes are unable to conduct the full resources of the power supply after the initial discharge of the screen current resevoir.

Because guitar amplifiers are often driven intentionally into massive power clipping in certain musical styles, desirable distortion response is a sought-after virtue, one which is not to be found in text books or prior commercial art: these are devoted to avoiding distortion, not culturing it. Two desirable musical characteristics of the Modified Power Amplifier of the present disclosure are its fluid dynamic response and its agreeable distortion overtones when driven into severe distortion. In addition to the contributions made by the lagging dynamic screen supply described above, there is another circuit component of unusual value which further compliments distortion performance: a pair of very high value series resistors used in coupling signal from the driver into the control grids of the output tubes. At signal levels below heavy clip, these resistors are largely non-functional. But as drive signals increase and the output tubes are driven into Class AB 2, the flow of grid current through the high value resistors causes a corresponding drop in drive signal voltage. Thus, dynamic response is heavily "cushioned" shortly into AB 2 operation because increasingly large drive signals are increasingly attenuated by the high value series resistance. Meanwhile, smaller amplitude drive signals (while string vibration decays, for example) encounter little or no attenuation. The result is to further enhance the fluid dynamic characteristics of the Modified Power Amplifier when it is heavily overdriven. Musicians describe this performance as "smooth sustain" because notes seem to "hang on" with little noticeable decay and take on aspects of a saxophone or bowed violin when the distortion harmonics are "right." The high series resistance also helps produce an overall desirable distortion mix because limiting drive also prevents excess cross-over (notch) distortion in the push-pull power stage. Because cross-over distortion produces an odd-order harmonic product, it will—if allowed to dominate—create a thin and buzzy distortion timbre, that is not musically desirable.

Thus, a general object of the present invention is to provide a power amplifier which achieves a hitherto unknown, improved dynamic response which varies in accordance with the amplitudes and energies of musical subject matter such as those generated by an electrical guitar in a manner which overcomes drawbacks and limitations of the prior art.

The present invention will be more fully understood and appreciated when considered in light of the following detailed description of a preferred embodiment, presented in conjunction with the accompanying drawings.

BRIEF DESCRIPTION OF THE DRAWINGS

In the Drawings:
FIG. 2 is a graph of operating characteristics of the amplifier depicted in FIG. 1, further illustrating the principles of the present invention.

DETAILED DESCRIPTION OF A PREFERRED EMBODIMENT

Figure 1:
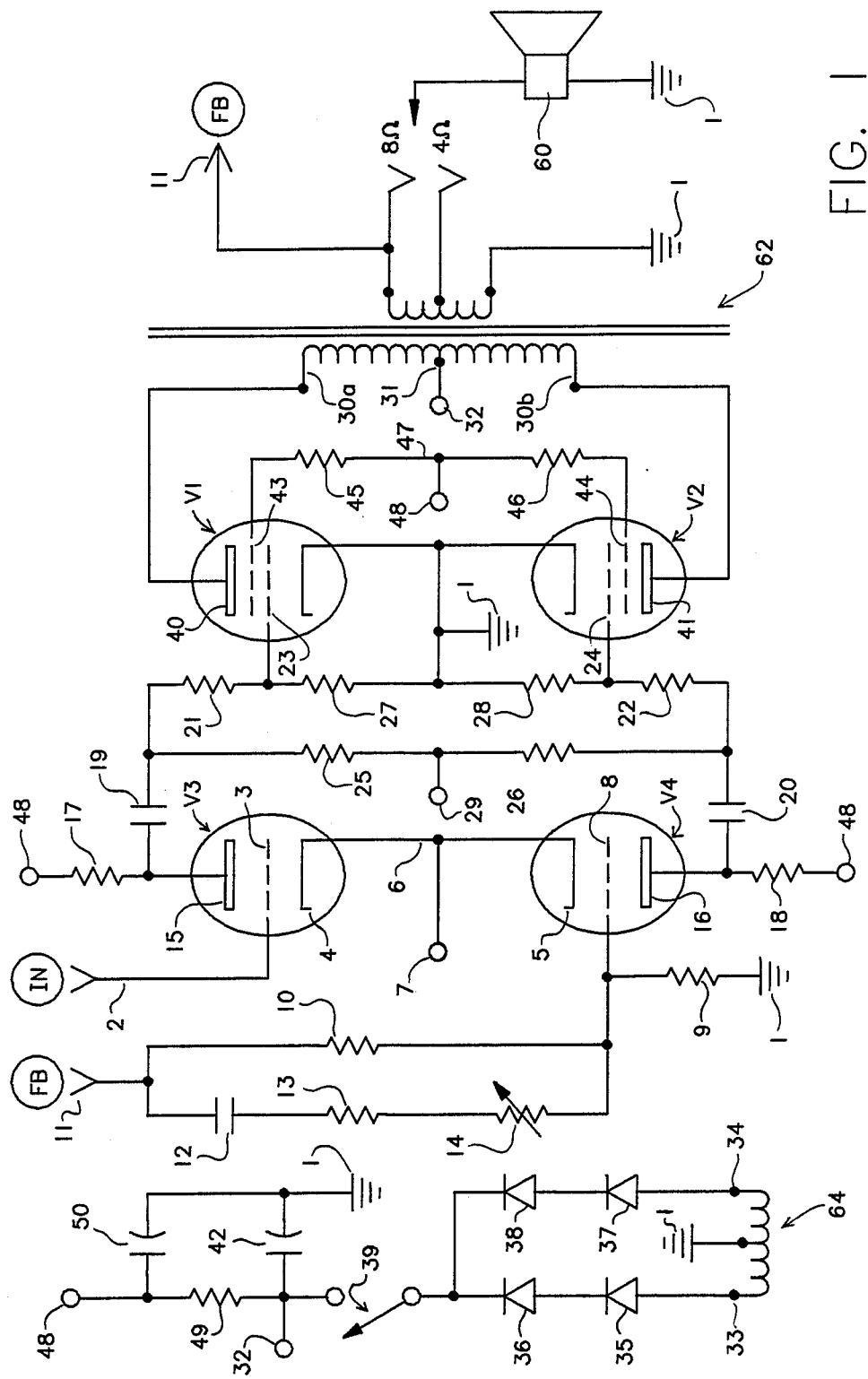
FIG. 1 is a schematic circuit diagram of a push-pull pentode vacuum tube power amplifier circuit incorporating the principles of the present invention.

A preferred embodiment of a Modified Power Amplifier incorporating the principles of the present invention is shown in the FIG. 1 schematic drawing as utilizing a pair of beam power pentode vacuum tubes V1 and V2 arranged in a push-pull configuration and coupled to the utilization device (loudspeaker 60 through a conventional push-pull output transformer 62). The V1 and V2 vacuum tubes may be any matched pair of beam power tubes, such as types 6BQ5, EL84, 6L6, or other equivalents. A split phase drive signal is provided by a pair of triode vacuum tubes V3 and V4 arranged as a differential amplifier pair.

The input circuit is evidenced by a conductor 2, leading to a grid 3, of the V3 triode whose cathode 4 is coupled to the cathode 5 of the V4 triode via a conductor 6. Both of the cathodes 4 and 5 are biased from a negative bias power supply 7 for proper differential operation. Control grid 8 of triode V4 is coupled to ground 1 via resistor 9 which also serves as a low resistance shunt resistor in a divider network including series resistor 10. This network applies negative feedback 11 from the secondary of the power transformer 62 to the V3-V4 driver circuit. A capacitor 12, in conjunction with a fixed resistor 13 and a variable attenuator 14 together comprise a high frequency attenuation network which is adjustable by the user. The anodes 15 and 16 of the phase splitter, driver tubes V3 and V4, are coupled to the high voltage supply 48 through two load resistors 17 and 18.

Amplified, split phase A. C. drive voltage is coupled from the plates 15 and 16 of the tubes V3 and V4 via capacitors 19 and 20 and resistors 21 and 22 to the control grids 23 and 24 of two push-pull power output pentode vacuum tubes V1 and V2. Resistors 21 and 22 would not ordinarily be required in a similar—but unmodified—amplifier; standard practice would be to connect the output ends of coupling capacitors 19 and 20 directly to the control grids 23 and 24.

In the Modified Power Amplifier of the present disclosure, resistors 21 and 22 are inserted, their individual resistance each being approximately 220,000 ohms. The purpose of each of these resistors 21 and 22 is to form the series element of a voltage divider network whose shunt element then becomes the respective grid 23 and 24 of output tubes V1 and V2 when signal drive is of such magnitude as to cause current to flow in said grid circuit. This configuration is sometimes described as Class AB2 operation.

Resistors 21 and 22 impose a dynamic attenuation to drive voltage appearing across them, which attenuation becomes greater as the drive signal amplitude (and grid current through the circuit) increases.

In the preferred embodiment, the output tubes V1 and V2 utilize a fixed control grid bias voltage supplied at a node 29, which is distributed to output tube control grids 23 and 24 by resistors 25 and 26 respectively. Resistors 27 and 28 are each typically ten times the value of resistors 21 and 22 and the resistors 27, 28 stabilize the bias voltage drop through resistors 25, 26, 21 and 22 by allowing a small amount of current to flow when the control grids 23 and 24 are not drawing current themselves.

The anode elements 40 and 41 of output pentodes V1 and V2 are coupled to opposite ends 30a, 30b of the output transformer primary winding whose center tap 31 receives D. C. high voltage from the primary B+ point 32 of the power supply circuit 64. The high voltage push-pull windings 33, 34 of the power transformer of the supply 64 are coupled to a full wave rectifier comprising diodes 35, 36, 37 and 38.

A single-pole-single-throw switch 39, is used as a "standby" device and allows the tube heaters to remain on while high voltage is removed from the circuit. Electrolytic capacitor 42 is the main smoothing filter and completes the D. C. high voltage plate supply 64, its negative end being coupled to ground 1.

Screen grids 43 and 44 of output tubes V1 and V2 are connected together via low value resistors 45 and 46 (to prevent oscillation) at a conductor 47 which supplies the lagging dynamic high voltage described above from a node 48 in the power supply. In the preferred embodiment of the present disclosure, this same lagging dynamic voltage source is used to supply the driver tube V3, V4 circuitry as well.

When the output anodes 40 and 41 of the power pentodes V1 and V2 are driven into saturation, screen grids 43 and 44 begin to draw large amounts of current from supply point 48. For the first few hundred milliseconds, the large current draw depletes the charge stored in the electrolytic "reservoir" capacitor 50, which is connected between the dynamic high voltage node 48 and ground 1.

Resistor 49 couples high D. C. voltage from the main B+ point 32 to the dynamic B+ point 48 and thereby enables the capacitor 50 to become charged during intervals of low screen current flow. However, the resistor 49 is of a sufficiently high resistance value so that it acts significantly as a series dropping voltage divider during discharge of the capacitor 50 resulting from the large current demands from the screen grids 43 and 44.

In the preferred embodiment, which is only a seventeen output watt amplifier, resistor 49 has a value of 5600 ohms. This value allows the voltage which supplies the output screen grids 43, 44 as well as the driver circuitry of V3 and V4 to drop by as much as 50 volts or 20 percent. In the seventeen watt amplifier, the size of the capacitor 50 is a relatively large 30 mf and discharges over a period of approximately 50 to 500 milliseconds depending on the amplitude and duration of saturation in the plate circuit of V1 and V2.

After the storage resevoir capacitor 50 has drained down to the lowered incoming voltage supplied by resistor 49, the power sensitivity of the combined amplifier is significantly reduced and the output tubes V1 and V2 are unable to conduct the full resources of the high voltage power supply 32. Soft clipping distortion with smooth, fluid attack conditions result.

Moreover, the A. C. drive voltage supplied by V3, V4 is also reduced as a result of lowered D. C. anode voltages from the dynamic supply point 48. The value of the time constant of the discharge/recharge rate of reservoir capacitor 50 via the screen load and the series resistor 49 is established empirically to produce the "best" combination of tactile and auditory musical sensations as judged by a panel of guitarists. As proof of the efficacy of the disclosed modification, a panel of different guitarists all independently chose the same time constant, which, in the 17 watt circuit shown, comprised 5600 ohms for resistor 49 and 30 microfarads for capacitor 50.

When an amplifier of twice the power was built in accordance with the principles of the present invention, the values preferred by the guitarist panel were consistent with the increase in screen current demand: 2800 ohms and 60 microfarads. In a conventional "unmodified" amplifier, there would clearly be no need for 60 mfd for the screen supply filter.

Referring now to FIG. 2, plot 1 shows the relationship of a voltage at the output tubes plates as a function of watts output. The relative flatness of the curve shows that the main high voltage supply, while not strictly regulated, is reasonably "stiff." Voltage drop under maximum load conditions barely exceeds ten percent.

Plot 2 shows the relationship of voltage at the output tube screen grids as a function of watts output. The steepness of the curve shows the voltage drop across the high value of resistor 49 of FIG. 1, after the storage reservoir capacitor 50 has discharged under load. Voltage drop is approximately thirty-three percent.

Plot 3 shows the difference between plate volts and screen volts as a function of output watts. Plots 1, 2 and 3 show voltages after stabilization under load has occured.

Plot 4 shows the instantaneous difference between plate volts and screen volts measured during a tone burst of approximately 150 miliseconds duration and of sufficient amplitude to drive the amplifier well into saturation. The difference between plots 3 and 4 represents a change in the voltage ratio of approximately fifty percent between the high dynamic state (supplying clean transient attacks and a resilient "elastic" feel) and the low dynamic state (which produces soft-clip harmonic characteristics and a smooth "forgiving" fluidity of note attack).

Having thus described an embodiment of the invention, it will now be appreciated that the objects of the invention have been fully achieved, and it will be understood by those skilled in the art to which this invention pertains that many changes in construction and circuitry and widely differing embodiments and applications of the invention will suggest themselves without departing from the spirit and scope of the invention. The disclosures and the description herein are purely illustrative and are not intended to be in any sense limiting.

I claim:

1. In a power amplifier for amplifying audio signals generated by a musical instrument a method for modifying the dynamic response of the power amplifier, the method comprising the steps of:

providing at least one pentode power amplifier tube means having at least a cathode element, a screen grid element and an anode element, for amplifying the audio signals and putting them out to a loudspeaker means, impressing the audio signals generated by the musical instrument on an electron beam amplitude control electrode of the tube means, charging a charge storage means having a predetermined discharge time constant with a charge of electrical energy to a predetermined potential, delivering the stored charge of electrical energy to the screen grid element of the tube means, establishing predetermined bias conditions for the tube means, whereby increased screen grid current flow causes the charge stored in the charge storage means to discharge in accordance with its discharge time constant, thereby changing the bias conditions of said tube means and modifying the dynamic response of said power amplifier to lower its power sensitivity in accordance with the predetermined discharge time constant of the charge storage means.

2. A power amplifier having modified dynamic response for amplifying audio signals generated by a musical instrument, the power amplifier comprising:

an input for receiving an incoming electrical signal corresponding to the audio signal generated by the musical instrument;

an output for driving loudspeaker means for converting the electrical signal as amplified and modified by the power amplifier into sound energy, at least one pentode power amplifier vacuum tube means having at least a cathode element, a control grid element, a screen grid element and an anode element, at least one of the cathode element and the control grid element being connected to the input for receiving the incoming electrical signal charge reservoir means having a predetermined charge time constant and a predetermined discharge time constant being connected to the screen grid element of the tube means, for storing a charge of electrical bias potential to a predetermined voltage, bias means for establishing a predetermined direct bias for the tube means, whereby under high amplitude input signal conditions, beam current between the cathode and anode elements becomes nonlinear causing increased current to flow at said screen grid element thereupon causing discharge of the potential stored in the charge reservoir means and thereby modifying dynamically the bias conditions of said tube means to lower power sensitivity thereof in accordance with the discharge time constant of the reservoir means.

3. A power amplifier circuit for amplifying and modifying musical sounds in accordance with a predetermined varying dynamic response characteristic, the amplifier circuit including:

an input for receiving an incoming audio signal corresponding to the musical sounds to be amplified;

an output including a push-pull audio output transformer for driving loudspeaker means for converting the electrical signal as amplified and modified by the power amplifier into sound energy, a power supply for supplying electrical power including bias voltage to said power amplifier circuit;

phase splitter means connected to said input for splitting the incoming audio signal into two opposed phases, push-pull pentode vacuum tube power amplifier means having beam control elements connected to said phase splitter means for receiving the incoming audio signal as two opposed phases, having anode elements connected to said push-pull audio output transformer, and having screen grid elements, for amplifying said two opposed phases in accordance with said predetermined varying dynamic response, said power supply including a screen grid bias output connected to said screen grid elements and including a charge storage reservoir capacitor to ground and a predetermined high value series resistor connected between the bias output and a high voltage source, the series resistor being selected so that screen grid current flow during cathode-plate peak beam current flow conditions causes the capacitor rapidly to discharge toward ground potential, thereby dynamically reducing beam current flow, and providing said amplifier with said predetermined varying dynamic response characteristic.

4. The power amplifier circuit set forth in claim 3 wherein said phase splitter means includes amplifier driver means receiving primary operating power from said charge storage reservoir capacitor.

5. The power amplifier circuit set forth in claim 3 wherein said beam control elements are connected to said phase splitter means through two series resistors for providing dynamic attenuation to said two opposed phase drive voltages appearing across them, which attenuation becomes greater as the drive voltage amplitude increases, thereby causing current to flow in the control grid circuit of said push pull amplifier means during a portion of the duty cycle thereof.

* * * * *